United States Patent [19]
Hara et al.

[11] Patent Number: 5,264,038
[45] Date of Patent: Nov. 23, 1993

[54] CHEMICAL VAPOR DEPOSITION SYSTEM

[75] Inventors: Tatsushi Hara, Inagi; Nobuhiro Misawa, Yokohama; Toshiya Suzuki, Kawasaki; Takayuki Ohba, Yokohama; Fumitake Mieno; Akio Yamaguchi, both of Kawasaki, all of Japan

[73] Assignee: Fujitsu Limited, Kawasaki, Japan

[21] Appl. No.: 567,224

[22] Filed: Aug. 14, 1990

[30] Foreign Application Priority Data

Aug. 18, 1989 [JP] Japan .................. 1-213477

[51] Int. Cl.$^5$ ............................ C23C 16/46
[52] U.S. Cl. ................... 118/719; 118/715; 118/725
[58] Field of Search ............. 118/715, 725, 719, 728

[56] References Cited

U.S. PATENT DOCUMENTS

| | | | |
|---|---|---|---|
| 3,098,763 | 7/1963 | Deal | 118/725 |
| 4,340,462 | 7/1982 | Koch | 204/298 |
| 4,774,416 | 9/1988 | Askary | 250/251 |
| 4,830,891 | 5/1989 | Nishitani et al. | 427/253 |
| 4,838,201 | 6/1989 | Fraas | 118/719 |
| 4,979,466 | 12/1990 | Nishitani | 118/725 |
| 5,000,113 | 3/1991 | Wang | 118/715 |

FOREIGN PATENT DOCUMENTS

| | | |
|---|---|---|
| 0283007 | 9/1988 | European Pat. Off. . |
| 61-127119 | 6/1986 | Japan . |
| 63-76876 | 4/1988 | Japan . |
| 0318395 | 5/1989 | Japan . |
| 2141386 | 12/1984 | United Kingdom . |

OTHER PUBLICATIONS

Berry, Thin Film Technology, Krieger Publishing Co., Huntington, N.Y. 1979, pp. 22-23.

Primary Examiner—Richard Bueker
Attorney, Agent, or Firm—Armstrong, Westerman, Hattori, McLeland & Naughton

[57] ABSTRACT

A chemical vapor deposition (CVD) system for depositing a material selectively on a part of a substrate comprises a reaction chamber in which a CVD process is performed, a substrate holder and substrate heater provided within the reaction chamber, a gas inlet fixture provided on the reaction chamber for introducing one or more CVD source gases into the reaction chamber, and a reactant distribution fixture provided on the gas inlet fixture within the reaction chamber for controlling distribution of the reactant species in the reaction chamber, wherein the reactant distribution fixture defines a subspace surrounding the substrate within the space of the reaction chamber such that the subspace has a dimension, measured in a direction generally perpendicular to the surface of the substrate such that the dimension is at least less than one half of the mean free path of the reactant species realized inside the space of the reaction chamber during the CVD process and such that an opening is formed for communicating the subspace inside the reaction distribution means with the rest of the space of the reaction chamber for freely passing product species formed as a result of the chemical reaction at the surface of the substrate.

10 Claims, 4 Drawing Sheets

CHEMICAL VAPOR DEPOSITION SYSTEM

BACKGROUND OF THE INVENTION

The present invention generally relates to chemical vapor deposition and more particularly to a system and method for depositing tungsten selectively on a metal part or semiconductor part of a substrate while prohibiting growth of tungsten layer on an insulator part.

Conventionally, chemical vapor deposition systems using a resistance heater as means for heating a substrate has been employed for depositing metals such as tungsten or semiconductors selectively on the substrate. In such a conventional system, not only the substrate alone but other part of the system in a reaction chamber such as a holder of the substrate or the heater itself are heated relatively uniformly, and associated therewith, there arises a problem in that byproducts of CVD reaction tends to be formed extensively on these heated parts. These byproducts tend to react with the insulator part of the substrate to form the nuclei of tungsten growth, and thereby, the selective growth of desired material such as tungsten on the substrate is no longer obtained.

In order to avoid this problem, localized heating of the substrate by infrared irradiation is commonly used. In the case of heating by the infrared irradiation, the substrate alone is heated and cooled rapidly and selectively while the holder or other parts in the reaction chamber of the CVD system are held relatively cool. However, the system using the resistance heater is supposed to be advantageous when the substrate is replaced one after another for mass production, because of the relatively stabilized temperature of the holder and the substrate.

FIG. 1 shows a conventional chemical vapor deposition system schematically.

Referring to FIG. 1, a source gas introduced into a reaction chamber 36 via an inlet tube 1 is released into the chamber through a shower nozzle 31. In the chamber 36, a substrate 33 is held on a holder 34 of quartz and the like, and the substrate 33 is heated via the holder 34 by a resistance heater 35 provided underneath the holder 34 at the outside of the reaction chamber 36. Further, the reaction chamber 36 is evacuated via an exhaust port 32 by an evacuation pump not illustrated as well as via another exhaust port 37a by an evacuation pump 37. When an infrared lamp is used for heating the substrate 33, the lamp may be provided underneath the holder 34 so as to irradiate the substrate 33 through the holder or may be provided above the substrate 33.

In the CVD system of FIG. 1, the shower nozzle 31 is separated from the wafer 33 by a distance of about 20 cm, and the source gas is introduced into the reaction chamber 36 after passing through a mesh structure in the shower nozzle 31 (not illustrated) such that the source gas uniformly covers the surface of the substrate 33.

Conventionally, the selective growth of tungsten by the CVD process has been generally undertaken at a relatively high total pressure such as $10^{-2}$ Torr or more. The evaluation of the property such as resistivity of the tungsten layer thus grown or corrosion taking place in the silicon substrate, is well documented.

However, when a resistance heater is used for the heat source 35 in particular, there arises a problem in that byproduct molecules such as $SiF_x$ are formed extensively at the heated surface of the holder 34 and the like as a result of the reaction of source gases such as $WF_6$ and $SiH_4$ and these byproduct molecules cause an unwanted reaction with the substrate 33 known as encroachment when the source gas, particularly $WF_6$ is transported to the substrate 33. Thereby, the quality of the tungsten layer deposited on silicon is degraded. Further, the byproduct molecules react with the insulator part of the substrate and form the nuclei for growth of tungsten. Thereby, the selective growth itself is lost.

Conventionally, it is known that such undesirable problems can be avoided when the total pressure in the reaction chamber is reduced below $10^{-3}$ Torr during the CVD process. It is generally accepted that such a reduction of the total pressure results in an increase in the mean free path of the byproduct molecules which increase in the mean free path facilitates the scavenging of the reaction chamber. According to the experiments conducted by the applicants of the present invention, the selectivity of tungsten growth is certainly improved when conducted under the total pressure of about $10^{-3}$ Torr or less as compared with the case where the growth is made under the total pressure of $10^{-2}$ Torr or more.

However, such a growth of tungsten under the reduced total pressure has a problem in that the rate of growth is too slow because of the reduced supply of reactant species to the substrate. Further, the problem of encroachment of tungsten into silicon causing the degradation of the tungsten layer is not completely solved.

SUMMARY OF THE INVENTION

Accordingly, it is a general object of the present invention to provide a novel and useful chemical vapor deposition system wherein the foregoing problems are eliminated.

Another object of the present invention is to provide a chemical vapor deposition system for selectively depositing a material layer on a part of a substrate, wherein a satisfactory growth rate can be achieved even when the deposition is undertaken at a reduced pressure, without degrading the selectivity.

Another object of the present invention is to provide a chemical vapor deposition system for selectively depositing a tungsten layer on a part of a silicon substrate exposed in an insulator layer provided thereon, wherein a satisfactory growth rate can be obtained even when the deposition is undertaken at a pressure of $10^{-3}$ Torr or less, without degrading the selectivity.

Another object of the present invention is to provide a chemical vapor deposition system for depositing a material such as tungsten on a substrate under a reduced pressure, wherein the encroachment of tungsten into the substrate is effectively suppressed.

Another object of the present invention is to provide a chemical vapor deposition system for depositing a material selectively on a part of a substrate, comprising a reaction chamber for defining a space in which a chemical vapor deposition process is performed, said reaction chamber having an evacuation port for evacuating the reaction chamber therethrough, holding means provided within the reaction chamber for holding a substrate on which a material layer is to be deposited, heating means for heating the holding means to hold the substrate on the holding means at a controlled temperature, gas inlet means provided on the reaction chamber for introducing one or more source gases into the reaction chamber, said source gases comprising reactant species which produce the material upon a CVD reaction taking place at a surface of the substrate, and evacuating means connected to the evacuation port of the reaction chamber for controlling the pressure in the reaction chamber, wherein there is provided reactant distribution means on the gas inlet means within the reaction chamber for controlling distribution of the reactant species in the reaction chamber, said reactant distribution means defining a subspace surrounding the substrate within the space of the reaction chamber such that the subspace has a dimension, measured in a direction generally perpendicular to the surface of the substrate such that the dimension is at least less than one half of the mean free path of the reactant species realized inside the space of the reaction chamber under a condition that the chemical vapor deposition process is in progress and such that there is formed an opening for communicating the subspace inside the reaction distribution means with the rest of the space of the reaction chamber for freely passing product species formed as a result of the CVD reaction. According to the present invention, the reactant species introduced into the reaction chamber are confined in the subspace defined by the reactant distribution means and an effective reaction, including an increased reaction rate, is achieved even when the total pressure in the reaction chamber is reduced. When the foregoing system is applied to the selective growth of tungsten on silicon, the problems such as non-selective growth of tungsten or degradation of quality of tungsten layer caused in association with the encroachment of tungsten are eliminated by reducing the total pressure to about $10^{-3}$ Torr or less, while still maintaining a satisfactory growth rate in spite of the reduced pressure of deposition.

Other objects and further features of the present invention will become apparent from the following detailed description of preferred embodiments when read in conjunction with attached drawings.

DETAILED DESCRIPTION

Hereinafter, the present invention will be described with reference to the drawings.

Figure 1:
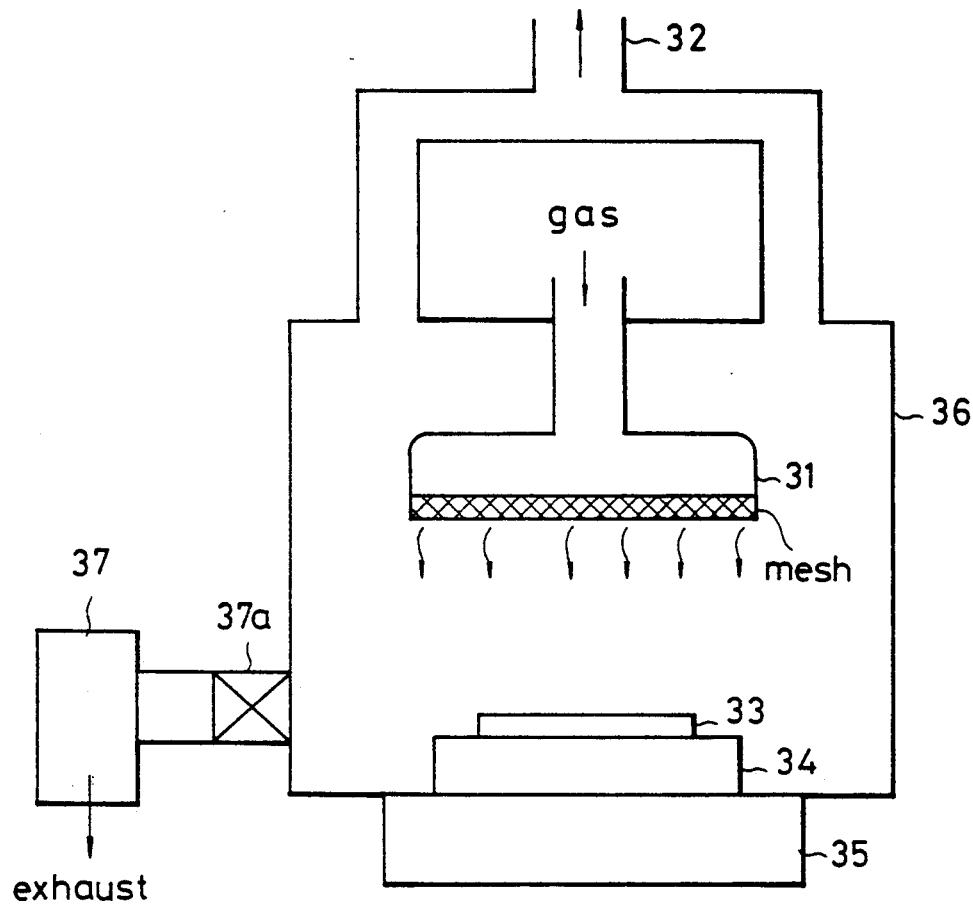
FIG. 1 is a schematic view showing the construction of a conventional CVD system having a shower nozzle for introducing reactant species into the reaction chamber.
Figure 2:
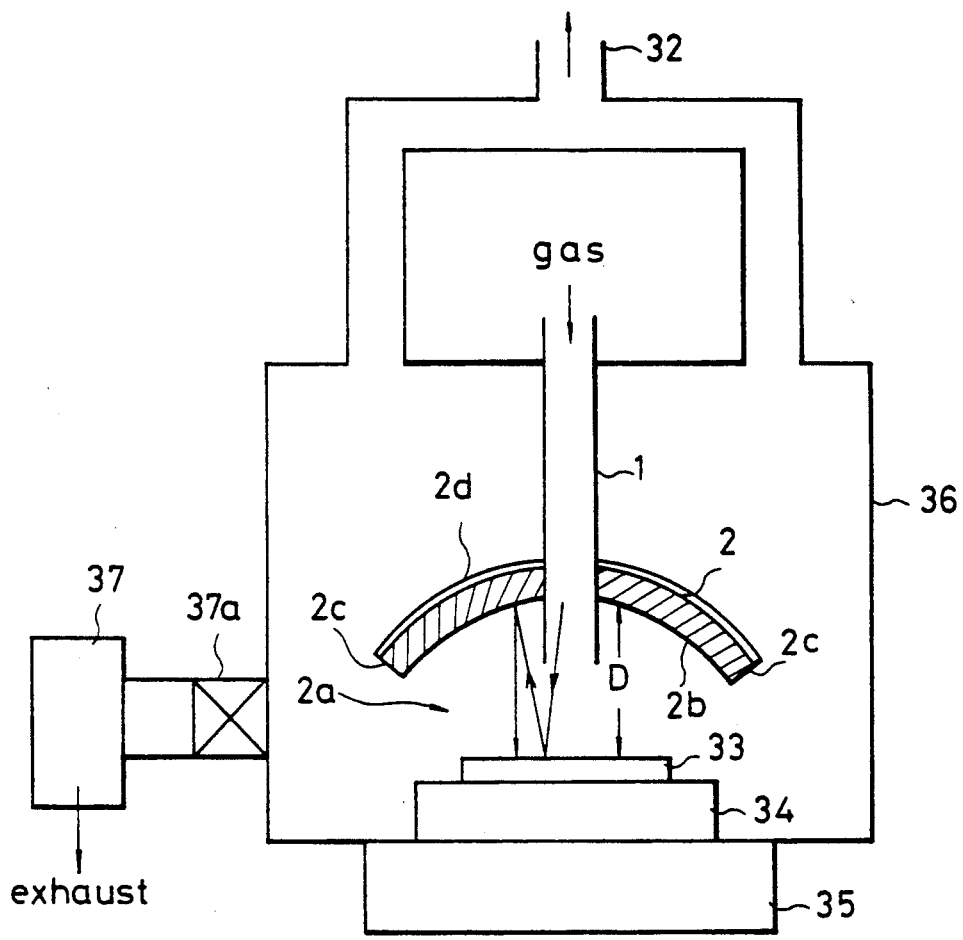
FIG. 2 is a schematic view showing the construction of a CVD system according to a first embodiment of the present invention.

FIG. 2 shows a first embodiment of the present invention. In the drawing, the parts corresponding to those already described with reference to FIG. 1 are given identical reference numerals and the description thereof will be omitted.

In the present embodiment, a reflection cover 2 is provided, somewhat like a collar, on the inlet tube 1 extending into the reaction chamber 36, and the reflector cover 2 defines a subspace 2a between the substrate 33 and the reflection cover 2. The reflection cover 2 has a concaved inner surface 2b surrounding the substrate 33 except for lateral ends 2c thereof, and confines the reactant species introduced into the chamber 36 via the inlet 1 within the subspace 2a. The reflection cover 2 is formed of a material such as silicon oxide which is relatively immune to the reaction with the source gases introduced into the reaction chamber 36. Further, there may be provided a metal layer 2d behind the reflection cover 2 so as to provide a mirror for reflecting the infrared radiation from the substrate 33 and the holder 34 back to the substrate 33 along the boundary between the reflection cover 2 and the matal layer 2d such that the mirror extends substantially parallel with the concaved inner surface 2b. Thereby, the temperature distribution of the substrate 33 is significantly improved.

In order to enhance the effect of confinement, the separation or distance D between the reflection cover 2 and the substrate 33 is set to be less that one half of the mean free path of the reactant species, tungsten hexafluoride $WF_6$ in this case, under the normal condition of the CVD process. In the illustrated example, the distance D is set to be about 50 mm. By setting the distance D as described, the reactant species, introduced into the subspace 2a from the inlet 1 and reflected back at the surface of the substrate 33 without causing reaction, are reflected again by the reflection cover 2 toward the substrate 33, and the probability of reaction taking place at the surface of the substrate 33 is substantially increased. It should be noted that the species introduced into the subspace 2a from the tube 1 have a moving direction generally perpendicular to the major surface of the substrate 33 and reflected back substantially in a reversed direction to the cover 2 when the species has failed to cause reaction at the surface of the substrate 33. The species thus reached the cover 2 is of course reflected back to the substrate 33 again. It should be noted that the temperature of the reflection cover 2 is substantially lower than the temperature of the substrate 33 and thus, no substantial reaction occurs when the reactant species are reflected at the reflection cover 2.

Further, as the opening 2a is formed at the lateral edge 2c of the reflection cover 2, any byproduct species formed at the surface of the substrate 33 escapes efficiently through the opening 2c without being scattered by collision with other species, as long as the deposition is made under the reduced pressure such as $10^{-3}$ Torr or less. In the case of the byproduct species, there is no directivity in the direction of movement, in contrast to the reactant species introduced through the inlet 1, and thus, substantial proportion of the byproduct species are escaped through the opening 2c whenever they are formed, without experiencing scattering.

The distance D between the reflection cover 2 and the substrate 33 is most preferably set to be equal to or less than one third of the mean free path of the reactant species in the reaction chamber 36. By setting the distance D as such, one can set the entire path length of the reactant species, introduced from the tube 1 and reaching the substrate after one reflection at the inner surface 2b of the reflection cover 2, to be equal to or smaller than the mean free path of the species. It should be noted that the reactant species travel the path of the length D three times in such a situation.

Hereinafter, the result of experiments undertaken with the CVD system of the present embodiment will be described.

EXPERIMENT 1

Deposition of tungsten is made into a contact hole formed in a PSG layer and exposing a silicon substrate underneath by supplying a $WF_6$ source gas and a $SiH_4$ source gas respectively with a flow rate of 5 sccm and 3.75 sccm at a substrate temperature of 260° C. The deposition was made under a total pressure of $5.0 \times 10^{-4}$ Torr with a duration of 300 seconds. After deposition for 300 seconds, the contact hole, having a depth of 1 um, was completely filled by tungsten. With further continuation of the deposition, it was confirmed that no tungsten deposition is made on the PSG layer. Thus, an excellent selectivity of tungsten growth is maintained. In the present example, a deposition rate of about 2000 Å/min was achieved which is a significant improvement over the conventional rate typically of 600 Å/min which is obtained when the shower nozzle 31 shown in FIG. 1 is used in place of the reflection cover 2 while holding the condition of deposition and configuration of the deposition system identical.

EXAMPLE 2

In this example, tungsten was deposited on an exposed surface of silicon through a contact hole provided on a PSG layer under exactly the same condition as in the case of EXAMPLE 2, with the deposition rate set at 1000 Å/min. In this experiment, the distance D between the reflection cover 2 and the substrate 33 was set to be 15 mm.

The following TABLE I shows the layer thickness of tungsten thus deposited and the resistivity thereof.

TABLE I

| layer thickness (Å) | resistivity ($\mu\Omega \cdot$ cm) |
| --- | --- |
| 6165 | 22.6 |
| 6285 | 22.3 |
| 6065 | 21.1 |
| 6270 | 22.6 |
| 5970 | 22.6 |
| 6055 | 22.8 |
| 6410 | 22.9 |
| 6540 | 23.1 |
| 6225 | 22.9 |

From TABLE I, it can be seen that the scattering of the resistivity value is less than about ±4.5%. This is a substantial improvement over prior art which gives the scattering of about ±8-9%. Further, the deposition rate was about 1000 Å/min which is substantially improved over the deposition rate of prior art which is about 600 Å/min as already described.

EXAMPLE 3

In this series of experiments, the deposition of tungsten is made, using the apparatus of FIG. 2, with various temperatures for the initial silicon-induced reduction of WF$_6$. The silicon-induced reduction means the reaction

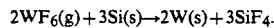

In each of the experiments for the silicon-induced reduction reaction, the flow rate of WF$_6$ was set to 5 sccm, the run duration 10 seconds, and the total pressure $3.0 \times 10^{-4}$ Torr. After the silicon-induced reduction, the temperature was set at 250° C. and the growth was continued, using the silane-induced reduction represented as

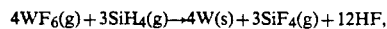

until a layer of tungsten having a thickness of 3000 Å is obtained. At the same time, another silane-induced reduction reaction occurs such that

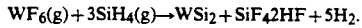

During this process, it should be noted that the foregoing reduction of WF$_6$ by Si also takes place. Thus, there are actually three reduction reactions of WF$_6$ proceeding parallel with eath other. As a result, the tungsten layer formed by the silane-induced reduction of WF$_6$ is not a pure tungsten but contains small amount of silicon.

According to the experiments, it was found that the tungsten layers, obtained by the silicon-induced reduction of WF$_6$ performed in the temperature range between 180° C.–300° C., showed a tendency that the encroachment is not significant, if not entirely eliminated. On the contrary, in the case of the samples wherein the silicon-induced reduction is achieved in the temperature above 300° C. such as 310° C. or 320° C., the degree of encroachment is unacceptably high. Further, it was found that the samples obtained by the silicon induced reduction performed at the temperature of 200° C. or more showed an excellent contact between the substrate silicon and the tungsten layer deposit thereon, while in the case of the samples wherein the silicon-induced reduction was performed below 200° C., for example at 180° C. or 190° C., showed a poor contact which is obviously undesirable for fabricating a semiconductor device.

In summary, the foregoing observations showed that the encroachment of tungsten into silicon can be minimized by using the temperature range between 200° C.–300° C. for the initial deposition of tungsten which is made by the silicon-induced reduction of the source gas containing tungsten. After a thin tungsten layer is formed, the deposition is continued using the silane-induced reduction.

Figure 3:
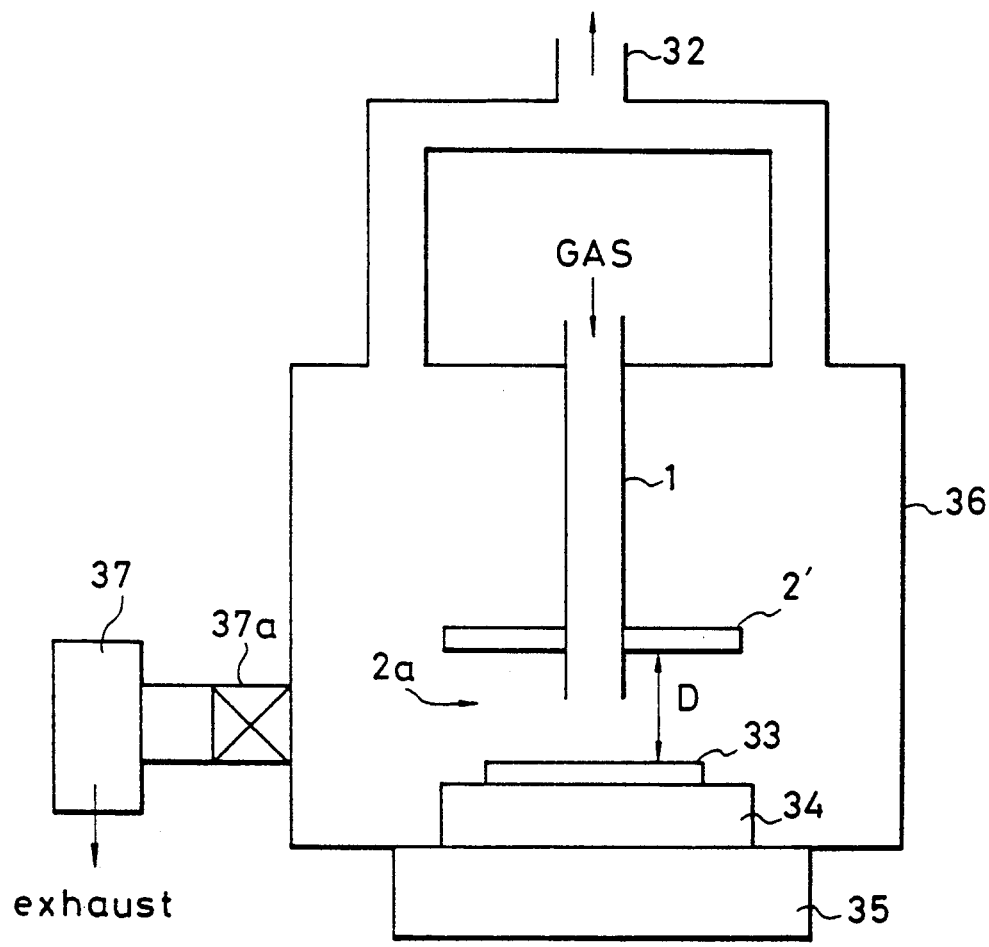
FIG. 3 is a diagram showing a second embodiment of the present invention.

The present invention is by no means limited to the embodiment of FIG. 2 employing the reflection cover 2 having the concaved inner surface 2b, but may be constructed according to a second embodiment shown in FIG. 3, wherein a flat reflection cover 2' is used. In this embodiment, too, the distance D is set to be less than one half, preferably less than one third of the mean free path of the reactant species introduced into the subspace 2a. As will be easily understood, this construction is also effective for confining the reactant species in the subspace 2a by reflecting back and forth between the cover 2 and the substrate 33.

Figure 4:
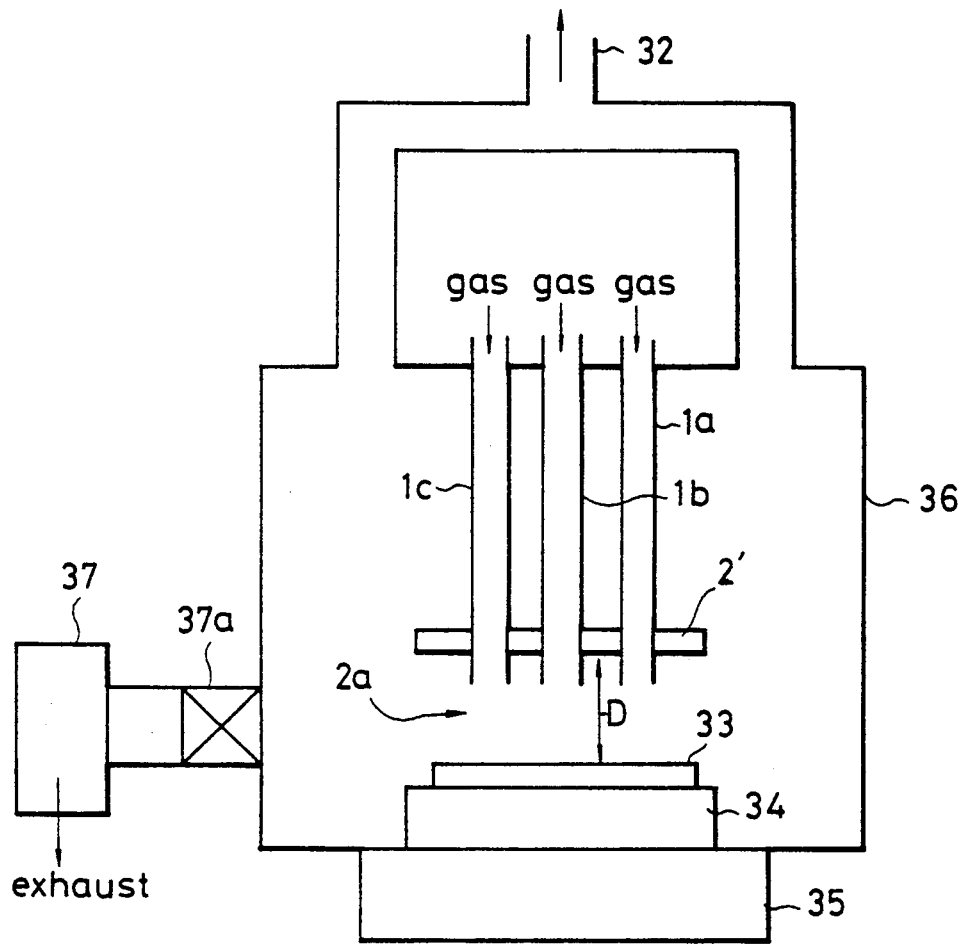
FIG. 4 is a diagram showing a third embodiment of the present invention.

FIG. 4 shows another embodiment, wherein the source gas is introduced along a number of inlet tubes 1a-1c. In this construction, too, the reflection cover 2' having the flat configuration is provided so as to define the subspace 2a between the cover 2' and the substrate 33 with the separation D set equal to or smaller than the mean fee path of the reactant species introduced into the subspace 2a. As the principle, operation and the effect of the present embodiment is obvious from the previous description, further description of this embodiment will be omitted.

Using the CVD system of the present invention, one can achieve a deposition of material, particularly of tungsten, with substantially improved deposition rate while without sacrificing the selective growth.

Further, the present invention is not limited to the embodiments described heretofore but various variations and modifications may be made without departing from the scope of the invention.

What is claimed is:

1. A chemical vapor deposition system for depositing a material selectively on a part of a substrate, comprising:

a reaction chamber for defining a space in which a chemical vapor deposition process is performed, said reaction chamber having an evacuation port adapted for connection to an evacuation unit for evacuating said reaction chamber therethrough;

holding means provided within said reaction chamber for holding a substrate on which a material layer is to be deposited;

heating means for heating said holding means to hold said substrate on said holding means at a controlled temperature;

gas inlet means provided on said reaction chamber for introducing at least one source gas into said reaction chamber, said at least one source gas including reactant species which produce said material upon a chemical reaction taking place in the vicinity of a surface of said substrate; and reactant distribution means provided on said gas inlet means within said reaction chamber for controlling distribution of said reactant species in said reaction chamber, said reactant distribution means forming a subspace surrounding said substrate within said space of said reaction chamber such that there is formed an opening for communicating said subspace inside said reaction distribution means with the rest of said space of said reaction chamber for freely passing byproduct species formed as a result of said chemical reaction at the surface of said substrate;

said gas inlet means including a tube extending into the reaction chamber, said tube extending in an axial direction and having an outlet of said source gas for introducing said source gas into said reaction chamber;

said reactant distribution means including a plate member provided on said tube to extend generally in a radial direction that is perpendicular to said axial direction such that said plate member reflects molecules of the reactant species introduced into said subspace through said tube and reflected at the surface of said substrate, without causing chemical reaction, again to said substrate;

said plate member having an inner surface facing said substrate and an outer surface opposing said inner surface, said inner surface defining said subspace, said plate member being provided on said tube such that said outlet of said tube is located inside said subspace;

said reactant distribution means carrying reflection means on said outer surface of said plate member for reflecting infrared radiation back to said substrate so that said substrate is uniformly heated.

2. A chemical vapor deposition system as claimed in claim 1, wherein said gas inlet means comprises a tube extending into the reaction chamber, and said reactant distribution means comprises a plate means provided on the tube for reflecting molecules of the reactant species introduced into the subspace through the tube and reflected at the surface of the substrate without causing the chemical reaction, again to the substrate.

3. A chemical vapor deposition system as claimed in claim 2, wherein said plate means comprises a material which causes substantially no reaction with the reactant species introduced in the reaction chamber.

4. A chemical vapor deposition system as claimed in claim 2, wherein said plate means comprises silicon oxide.

5. A chemical vapor deposition system as claimed in claim 2, wherein said plate means has a concave inner surface facing the substrate.

6. A chemical vapor deposition system as claimed in claim 2, wherein said plate means has a flat surface facing the substrate.

7. A chemical vapor deposition system as claimed in claim 1, wherein said gas inlet means comprises a plurality of tubes on which the reactive species distribution means is mounted.

8. A chemical vapor deposition system as claimed in claim 2, wherein said reflection means comprises a metal layer provided on the plate means for providing a mirror surface extending parallel with an inner surface of the plate facing the substrate.

9. A chemical vapor deposition system as claimed in claim 1, wherein said reactive species distribution means is provided such that said dimension of the subspace is about one-third of the mean free path of the reactant species in the subspace.

10. A chemical vapor deposition system for depositing a material selectively on a part of a substrate, comprising:

a reaction chamber for defining a space in which a chemical vapor deposition process is performed, said reaction chamber having an evacuation port adapted for connection to an evacuation unit for evacuating said reaction chamber therethrough;

holding means provided within said reaction chamber for holding a substrate on which a material layer is to be deposited;

heating means for heating said holding means to hold said substrate on said holding means at a controlled temperature;

gas inlet means provided on said reaction chamber for introducing at least one source gas into said reaction chamber, said at least one source gas including reactant species which produce said material upon a chemical reaction taking place in the vicinity of a surface of said substrate; and reactant distribution means provided on said gas inlet means within said reaction chamber for controlling distribution of said reactant species in said reaction chamber, said reactant distribution means forming a subspace surrounding said substrate within said space of said reaction chamber such that there is formed an opening for communicating said subspace inside said reaction distribution means with the rest of said space of said reaction chamber for freely passing byproduct species formed as a result of said chemical reaction at the surface of said substrate;

said gas inlet means including a tube extending into the reaction chamber, said tube extending in an axial direction and having an outlet of said source gas for introducing said source gas into said reaction chamber;

said reactant distribution means including a plate member provided on said tube to extend generally in a radial direction that is perpendicular to said axial direction such that said plate member reflects molecules of the reactant species introduced into said subspace through said tube and reflected at the surface of said substrate, without causing chemical reaction, again to said substrate;

said plate member having an inner surface facing said substrate and an outer surface opposing said inner surface, said inner surface defining said subspace, said plate member being provided on said tube such that said outlet of said tube is located inside said subspace;

said reactant distribution means carrying reflection means on said outer surface of said plate member for reflecting infrared radiation back to said substrate so that said substrate is uniformly heated.

wherein the subspace is operated under a pressure of at most substantially $10^{-3}$ Torr.

* * * * *